United States Patent [19]
Maldonado

[11] Patent Number: 5,852,421
[45] Date of Patent: *Dec. 22, 1998

[54] DUAL-BAND ANTENNA COUPLER FOR A PORTABLE RADIOTELEPHONE

[75] Inventor: David Maldonado, San Diego, Calif.

[73] Assignee: Qualcomm Incorporated, San Diego, Calif.

[ * ] Notice: The term of this patent shall not extend beyond the expiration date of Pat. No. 5,812,094.

[21] Appl. No.: 760,024

[22] Filed: Dec. 4, 1996

Related U.S. Application Data

[63] Continuation-in-part of Ser. No. 626,786, Apr. 2, 1996.
[51] Int. Cl.⁶ .............. H01Q 1/24; H01Q 1/32; H01Q 1/52
[52] U.S. Cl. .......... 343/702; 343/713; 343/715; 343/841; 343/895; 455/89; 455/90
[58] Field of Search .................. 343/702, 713, 343/715, 841, 895, 906; 455/89, 90; H01Q 1/24

[56] References Cited

U.S. PATENT DOCUMENTS

| | | | |
|---|---|---|---|
| 3,337,280 | 8/1967 | Joseph et al. | 343/702 |
| 3,349,405 | 10/1967 | Wright | 343/702 |
| 4,654,669 | 3/1987 | Kropielnicki et al. | 343/704 |
| 5,158,483 | 10/1992 | Fishman et al. | 439/668 |
| 5,289,199 | 2/1994 | Viereck | 343/745 |
| 5,304,998 | 4/1994 | Lopez | 343/767 |
| 5,343,214 | 8/1994 | Hadzoglou | 343/713 |
| 5,374,937 | 12/1994 | Tsunekawa et al. | 343/702 |
| 5,493,702 | 2/1996 | Crowley et al. | 455/89 |
| 5,557,287 | 9/1996 | Pottala et al. | 343/702 |
| 5,652,599 | 7/1997 | Pitta et al. | 343/702 |
| 5,710,984 | 1/1998 | Millar et al. | 343/702 |

FOREIGN PATENT DOCUMENTS

| | | | |
|---|---|---|---|
| 0718981 | 6/1996 | European Pat. Off. | H04B 1/38 |
| 2821070 | 11/1979 | Germany | H03H 7/46 |
| 9513668 | 5/1995 | WIPO | H04B 7/100 |

*Primary Examiner*—Anita Pellman Gross
*Assistant Examiner*—Daniel St. Cyr
*Attorney, Agent, or Firm*—Russell B. Miller; Charles D. Brown

[57] ABSTRACT

A dual-band antenna coupler for use in an adapter for portable radiotelephone. A plurality of curved bands of metal are positioned on a ground plane, with at least two of the plurality of curved bands of metal being electrically isolated from the ground plane so as to couple radio frequency (RF) signals to and from the antenna of the portable radiotelephone. The isolated curved bands of metal couple RF signals between the antenna of the portable radiotelephone and first and second matching circuits designed to match the portable radiotelephone antenna at each of the respective frequency bands. A selector switch coupled to the output of the matching circuits selects the appropriate matching circuit output for connection to an external antenna. The adapter also includes at least one ground pin mounted on the ground plane. When the portable radiotelephone is interfaced with the antenna coupler, the ground pin makes electrical contact with a ground reference connection on the portable radiotelephone.

20 Claims, 6 Drawing Sheets

DUAL-BAND ANTENNA COUPLER FOR A PORTABLE RADIOTELEPHONE

CROSS-REFERENCE TO RELATED APPLICATION

The present application is a continuation-in-part of U.S. patent application Ser. No. 08/626,786 filed on Apr. 2, 1996.

BACKGROUND OF THE INVENTION

1. Field of the Invention

The present invention relates generally to antenna couplers. More particularly, the present invention is directed to a novel and improved antenna coupler for a portable radiotelephone.

2. Description of the Related Art

In the field of cellular communications, portable radiotelephones are used to communicate with base stations over radio-frequencies (RF). Typically, these portable radiotelephones operate at relatively low power levels in order to conserve battery power and increase talk time. However, when there are alternate power means available, such as a vehicle battery when driving, or a conventional electrical outlet when indoors, the user of the portable radiotelephone often employs special adapters to take advantage of the higher power supply available. For example, there are many vehicular adapters which transform the vehicle-generated electrical supply into a level suitable for use by the portable telephone, and also couple the RF signals to and from the portable radiotelephone for use with an external power booster and antenna. Additionally, these adapters may include a "hands-free" kit including an auxiliary microphone and speaker. In this way, the user may take advantage of higher power transmission and hands-free conversation without sacrificing battery time, and yet still be able to carry the same portable radiotelephone with him when he leaves his car.

In order to couple the RF signal to and from the portable radiotelephone, a typical vehicular adapter uses an inductive coupler placed close to the portable radiotelephone's antenna. However, this technique may result in a significant amount of RF signal energy loss, particularly when an insufficient RF return path, or ground, is provided to the portable radiotelephone while it is in the adapter. Since a typical portable radiotelephone's internal components are encased in an electromagnetic interference (EMI) shield to prevent stray electromagnetic energy leaking from the radiotelephone's casing, the prior art vehicular adapters have not been able to achieve a sufficient RF return path to the portable radiotelephone.

SUMMARY OF THE INVENTION

The present invention is embodied in an antenna coupling device used to adapt a portable radiotelephone capable of operation in two frequency bands. The antenna coupling device comprises a ground plane having an upper surface with an antenna coupler mounted on the upper surface. The antenna coupler couples radio signals to and from the communication device antenna. The ground plane also includes at least one ground pin capable of contacting an externally accessible ground point on the radio communication device. A matching circuit coupled to the antenna coupler generates a predetermined impedance to match the antenna coupler to the communication device antenna at each of the first and second frequency bands.

The ground plane may also include first and second abutting vertical portions mounted on the upper surface thereof. The first and second abutting vertical portions are positioned in a substantially orthogonal relation to each other and to the ground plane upper surface. In a first embodiment, a plurality of curved metal bands are positioned in proximity with the ground plane with a first of the curved bands being electrically isolated from the ground plane to couple radio signals to and from the communication device antenna when the communication device is operating in a first of the two frequency bands. A second of the curved bands is also electrically isolated from the ground plane to couple radio signals to and from the communication device antenna when the communication device is operating in a second of the two frequency bands. A third of the curved bands is electrically coupled to the ground plane. The matching circuit may comprise first and second matching circuit portions each having an input terminal to match the communication device antenna. The first matching circuit portion is used when the communication device is operating in the first frequency band and the second matching circuit portion is operational when the communication device is operating in the second frequency band. The input terminal of the first matching circuit portion is coupled to the first curved band while the second matching circuit portion input terminal is coupled to the second curved band.

In a second embodiment, a coupling pin makes direct contact with a radio frequency component of the communication device, such as the communication device antenna. In this embodiment, there is no need to couple the signal over the air using the curved bands. The output from the coupling pin may be connected to a single dual-band matching circuit designed to generate a predetermined impedance to match the antenna coupler to the communication device antenna at each of the first and second frequency bands. Alternatively, the coupling device may include a switch circuit coupled between the coupling pin and first and second matching circuit portions. The switch circuit couples the coupling pin to the first matching circuit portion for operation of the communication device in the first frequency band and couples the coupling pin to the second matching circuit portion for operation of the communication device in the second frequency band.

In yet a third embodiment, a helical coupler surrounds at least a portion of the communication device antenna and couples the radio frequency signals over the air.

The signals from the matching circuit or matching circuit portions may be optionally connected to a booster amplifier and connected to an external antenna.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figures 1A, 1B:
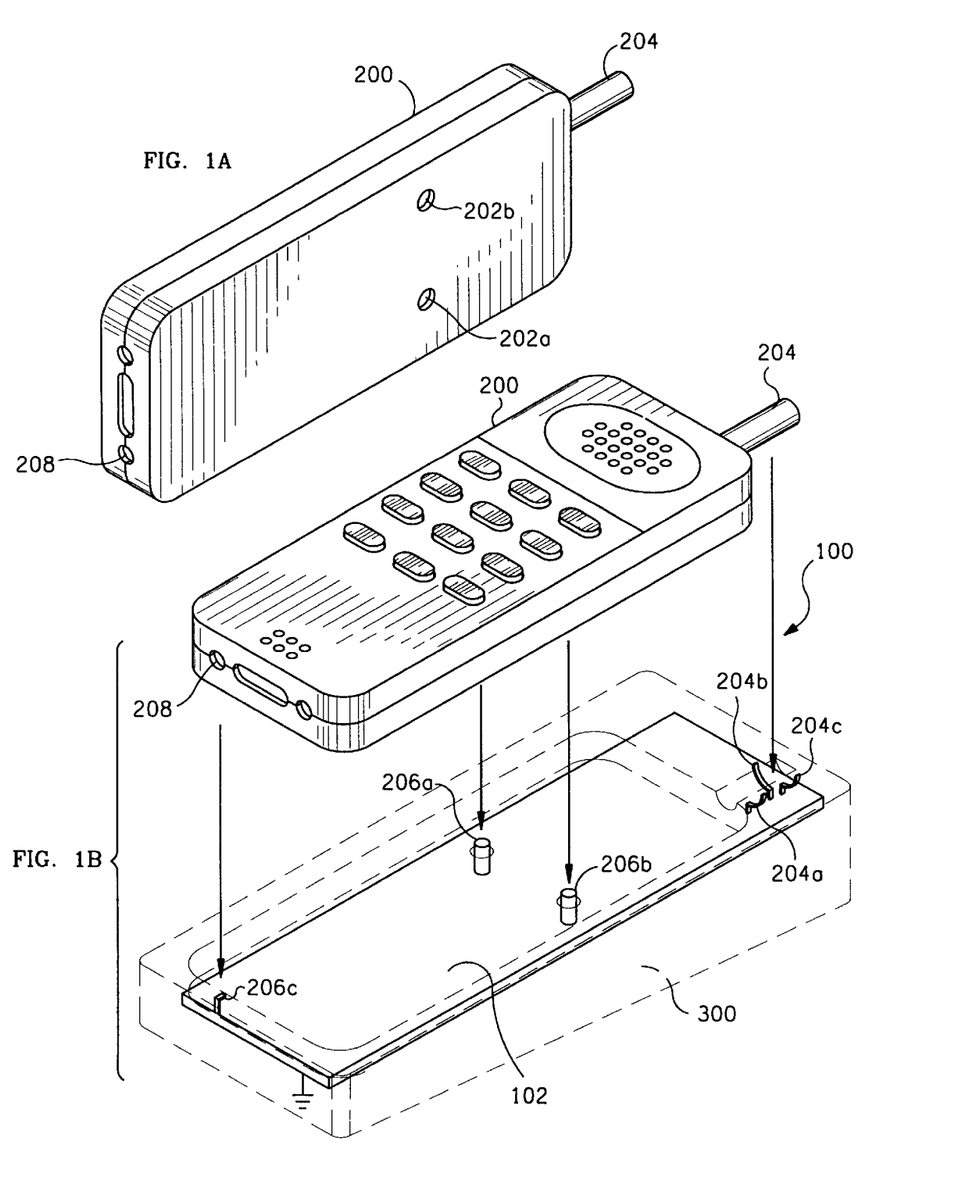
FIG. 1A is an illustration of an exemplary portable radiotelephone suitable for use with the present invention.
FIG. 1B is an illustration of a first embodiment antenna coupler of the present invention interfacing with an exemplary portable radiotelephone.

Referring to FIG. 1B, a first embodiment of the antenna coupler 100 of the present invention comprises ground plane 102, abutting vertical ground plane portions 104 and 106, coupling elements 204a, 204b, and 204c, ground pins 206a, and 206b, and optional ground pin 206c. Coupling elements 204a, 204b, and 204c are preferably constructed of vertically facing, curved bands of a conductive material, such as copper, steel, or the like. When portable radiotelephone 200 is interfaced with antenna coupler 100, coupling elements 204a, 204b, and 204c receive retracted helix antenna 204 of portable radiotelephone 200 and couple RF signals to and from antenna 204. Coupling elements 204a, 204b, and 204c are constructed and positioned in such a way that when portable radiotelephone 200 is interfaced with antenna coupler 100, coupling elements 204a, 204b, and 204c extend in a semi-circular array, each covering approximately one-quarter of the circumference of antenna 204. It should be noted that antenna 204 may also be of a non-helical construction as is known in the art, such as a rod or loop antenna. It should also be noted that portable radiotelephone 200 may generally be any type of mobile communication device, such as a cellular or PCS radiotelephone, or a wireless local loop communication device.

Coupling elements 204a, 204b, and 204c are mounted at a respective coupler base to ground plane 102. In the preferred embodiment, ground plane 102 is a double-sided printed wiring board (PWB). However, a single-sided PWB would also provide an adequate construction for ground plane 102, or any large base coated with a layer of conductive material. Ground plane 102 provides an improved return path for RF energy from antenna 204 to a ground reference point within portable radiotelephone 200. Abutting vertical ground plane portions 104 and 106 also serve to improve the return path for RF energy from antenna 204 to a ground reference in radiotelephone 200. Abutting vertical ground plane portion 104 is positioned in a substantially parallel arrangement with respect to a top surface 200a (see FIG. 1B) of radiotelephone 200 when the radiotelephone is used with antenna coupler 100. Abutting vertical ground plane portion 106 is positioned in a substantially orthogonal position with respect to abutting vertical ground plane portion 104 thus placing abutting vertical ground plane portion 106 in a substantially parallel position with respect to a longitudinal axis of antenna 204 (see FIG. 1B).

In order to couple RF energy from antenna 204, at least one of coupling elements 204a, 204b, and 204c is electrically isolated from ground plane 102. Ground plane 102 also serves to electrically couple ground pins 206a, 206b, and (optionally) 206c to at least one of coupling elements 204a, 204b, and 204c. That is to say that each of ground pins 206a–206c, ground plane 102, and at least one of coupling elements 204a–204c share the same electrical ground potential. As such, a complete RF signal path may be provided for coupling of RF signals to and from antenna 204 by connecting ground pins 206a, 206b, and (optionally) 206c to a suitable ground on portable radiotelephone 200.

Figure 2A:
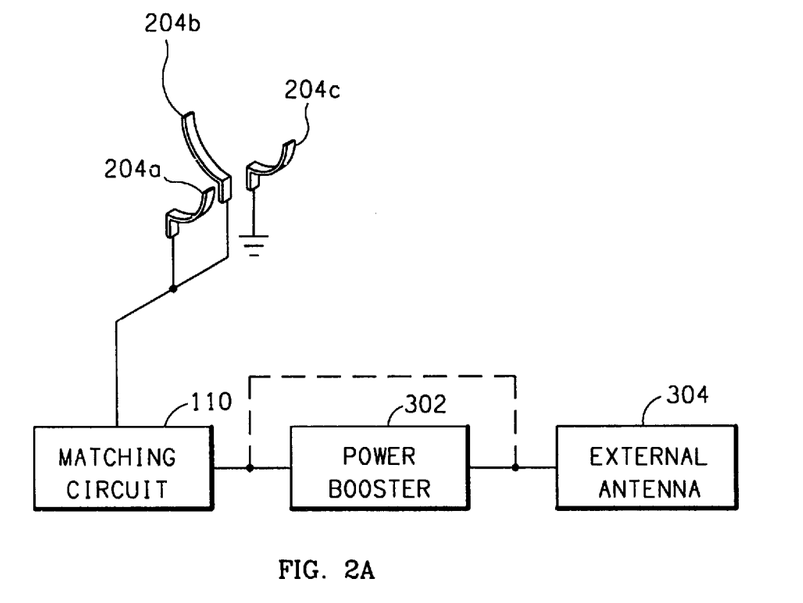
FIG. 2A is an illustration of one embodiment of the coupling elements of the present invention.

An exemplary connection scheme of the coupling elements 204a–204c of the present invention is seen in FIG. 2A. In FIG. 2A, coupling elements 204a and 204b are connected together, and electrically isolated from ground plane 102, while connector 204c is connected directly to ground plane 102. For signal transmission utilizing the present invention, RF signals from portable radiotelephone 200 (see FIG. 1B) are transmitted over the air by antenna 204. Coupling elements 204a and 204b couple off the RF energy from antenna 204 and pass it to matching circuit 110 which provides an impedance match between power booster 302 and antenna coupler 100. Optional power booster 302 increases the power of the RF signal coupled from antenna 204 and passes the resulting high-power signal to external antenna 304 for over-the-air transmission. For reception, the reverse signal flow occurs. RF signals received by external antenna 304 are optionally passed through power booster 302 and matching circuit 110 to coupling elements 204a and 204b where the signal energy is coupled to antenna 204 of portable radiotelephone 200.

Figure 2B:
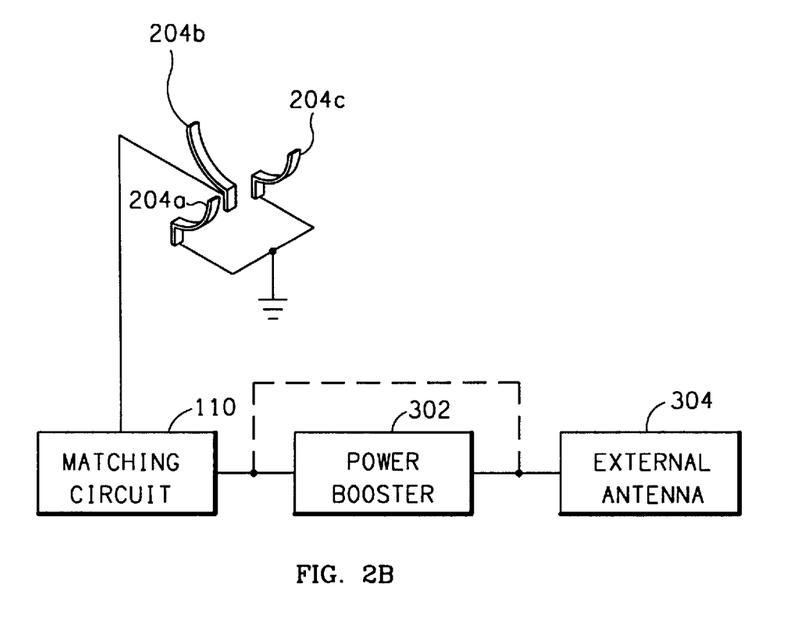
FIG. 2B is an illustration of an alternate embodiment of the coupling elements of the present invention.

An alternative connection scheme of the coupling elements 204a–204c is illustrated in FIG. 2B. FIG. 2B is similar to FIG. 2A, except that it is the outer two coupling elements, 204a and 204c which are both connected to ground plane 102, and only the inner coupling element 204b is electrically isolated from ground plane 102 and connected to matching circuit 110. This alternative arrangement of FIG. 2B has different RF characteristics than that of FIG. 2A, and may be more suitable for different operating frequency ranges or antenna structures.

Referring now to FIG. 1B, ground pins 206a and 206b make electrical contact with assembly screws 202a and 202b (see FIG. 1A) of portable radiotelephone 200. Since these assembly screws penetrate the internal electromagnetic shield (not shown) enclosing the internal components of portable radiotelephone 200, they improve the contact between the ground of antenna coupler 100 and portable radiotelephone 200. Although there is typically no direct contact between the assembly screws 202a and 202b of portable radiotelephone 200 and the internal electromagnetic interference (EMI) shield (not shown), the screws pass through the edges of the shield, providing sufficient ground potential. In the preferred embodiment, ground pins 206a and 206b are spring-loaded to ensure reliable contact with assembly screws 202a and 202b. Alternatively, radiotelephone 200 may be designed such that assembly screws 202a and 202b make direct physical contact with the internal EMI shield.

Direct contact may also be made between the ground plane 102 and the internal ground of portable radiotelephone 200 through ground pin 206c, which makes contact with battery ground port 208 of portable radiotelephone 200. In this optional configuration, coupling between the internal ground of portable radiotelephone 200 and ground plane 102 may also be accomplished. It should be understood that although the exemplary embodiment illustrated in FIG. 1 comprises three ground pins 206a, 206b, and 206c, alternate embodiments may comprise more or fewer pins to accomplish the same function.

Figure 3A:
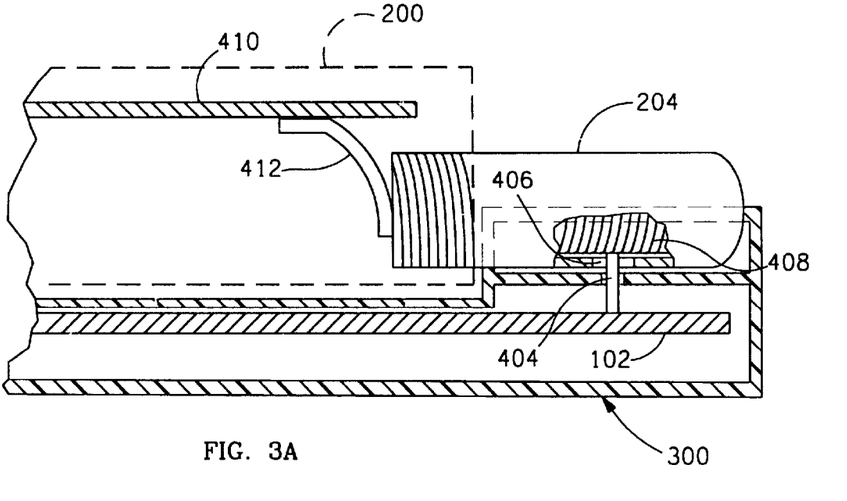
FIG. 3A is an illustration of a second embodiment of the antenna coupler of the present invention interfacing with a direct connection to an exemplary portable radiotelephone antenna, shown in a partially cut-away view.
Figure 3B:
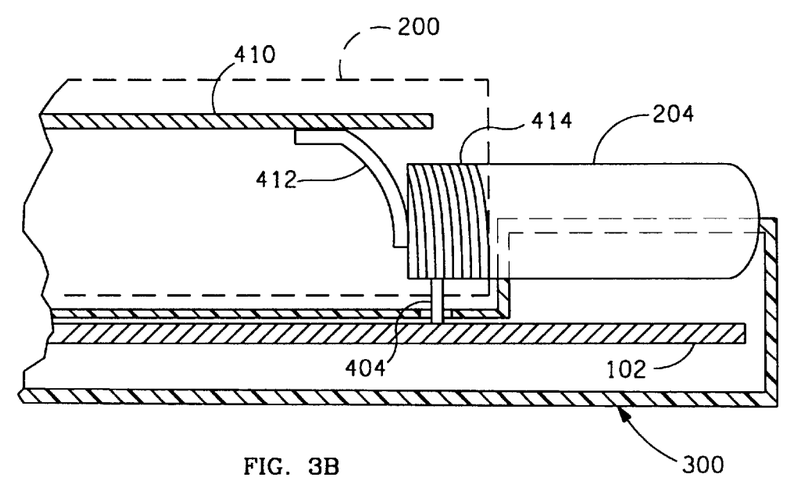
FIG. 3B is an illustration of a second embodiment of the coupling elements of the present invention interfacing with a direct connection to an internal component of an exemplary portable radiotelephone.

In a second embodiment of the antenna coupler of the present invention shown in FIGS. 3A and 3B, coupling elements 204a, 204b, and 204c of FIG. 1 are replaced with a direct contact coupling pin 404. Direct contact coupling pin 404 is mounted to, but electrically isolated from, ground plane 102. Direct contact coupling pin 404 makes physical contact with an internal component in the RF chain of radiotelephone 200. For example, if antenna 204 is encased in an insulative material, such as plastic, direct contact coupling pin 404 makes physical contact with the internal electrically conductive portion 408 of antenna 204 through a small opening 406 in the outer protective casing of antenna 204, as shown in FIG. 3A. Alternatively, portable radiotelephone 200 may have a small opening in its protective casing for direct contact coupling pin 404 to make physical contact with antenna nut 414 or antenna clip 412, or any suitable component in the RF chain of circuit board 410, all internal to portable radiotelephone 200. Direct contact of coupling pin 404 to an internal component in the RF chain of radiotelephone 200 as shown in either FIG. 3A or 3B obviates the need for the multiple coupler configuration associated with over-the-air coupling as shown in FIGS. 1 and 2. Again, it should be noted that antenna 204 may be of a non-helical design such as a rod or loop or other antenna design as is known in the art.

Figure 4A:
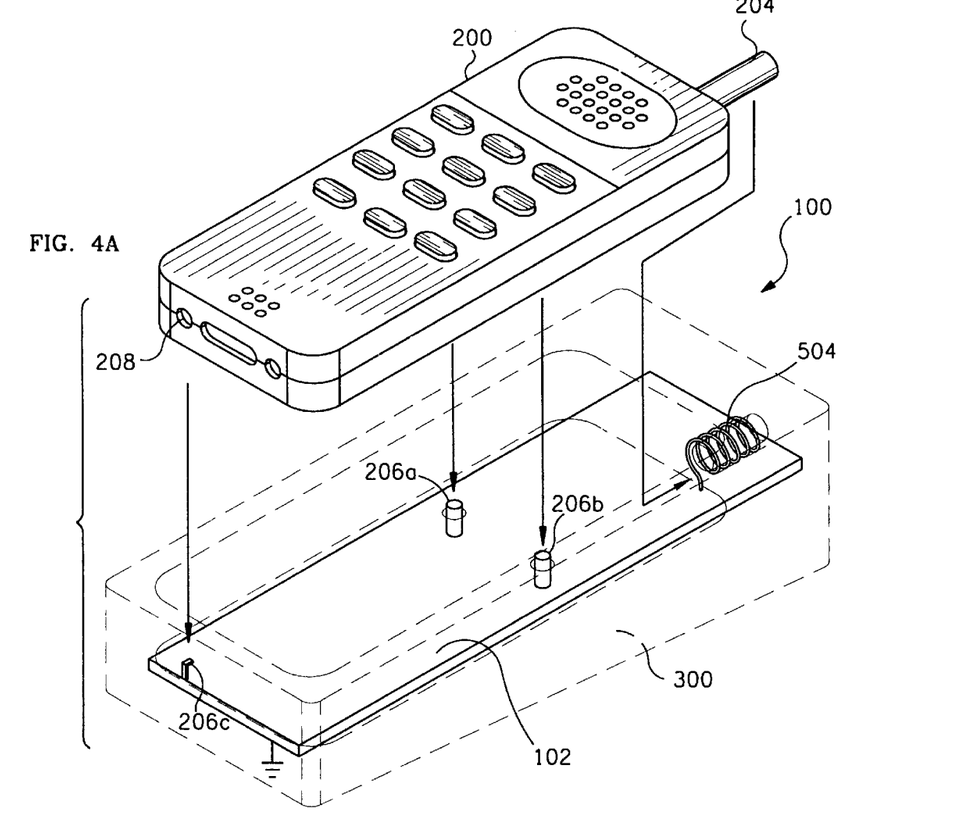
FIG. 4A is an illustration of a third embodiment antenna coupler of the present invention interfacing with an exemplary portable radiotelephone.
Figure 4B:
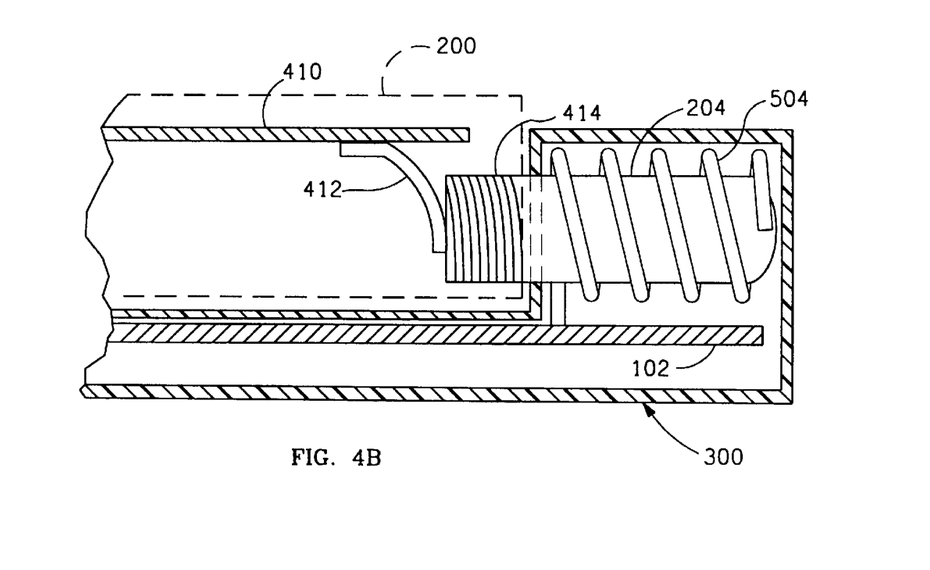
FIG. 4B is an illustration of the helical coupler of the third embodiment of the present invention interfacing with an antenna of an exemplary portable radiotelephone.

In a third embodiment of the antenna coupler 100 shown in FIGS. 4A and 4B, coupling elements 204a–204c may be replaced by a helical coupler 504. In this embodiment, when portable radiotelephone 200 is interfaced with antenna coupler 100, antenna 204 is inserted along a longitudinal axis within helical coupler 504. Helical coupler 504 is preferably constructed from a conductive wire such as copper, steel, or the like. RF coupling is accomplished over the air, similarly to that of coupling elements 204a–204c. However, in contrast to the semi-circular array arrangement of coupling elements 204a–204c as shown in FIG. 1, helical coupler 504 completely surrounds antenna 204. Also, helical coupler 504 is electrically isolated from ground plane 102. The embodiment of FIGS. 4A and 4B has different RF characteristics than that of FIGS. 1A and 1B or 3A and 3B, and may be more suitable for different operating frequency ranges or antenna structures.

Often, portable radiotelephone 200 is designed to operate in two separate frequency bands, such as operation in one frequency band designated for personal communications system (PCS) and a second frequency band designated for cellular telephone operation. When portable radiotelephone 200 is operational in two bands, it is desirable to provide appropriate matching circuits for antenna coupler 100 to maximize performance in each of the two bands. Some prior art portable radiotelephones include a terminal for direct coupling between the RF circuitry of the radiotelephone and an external antenna. A switch (not shown) inside the radiotelephone enables operation with the internal antenna or external antenna. However, the internal switch results in an insertion loss and subsequent decrease in RF output even when the portable radiotelephone is used with the internal antenna. The dual-band antenna coupler of the present invention overcomes this shortcoming by eliminating the internal antenna switching circuitry.

Figure 5A:
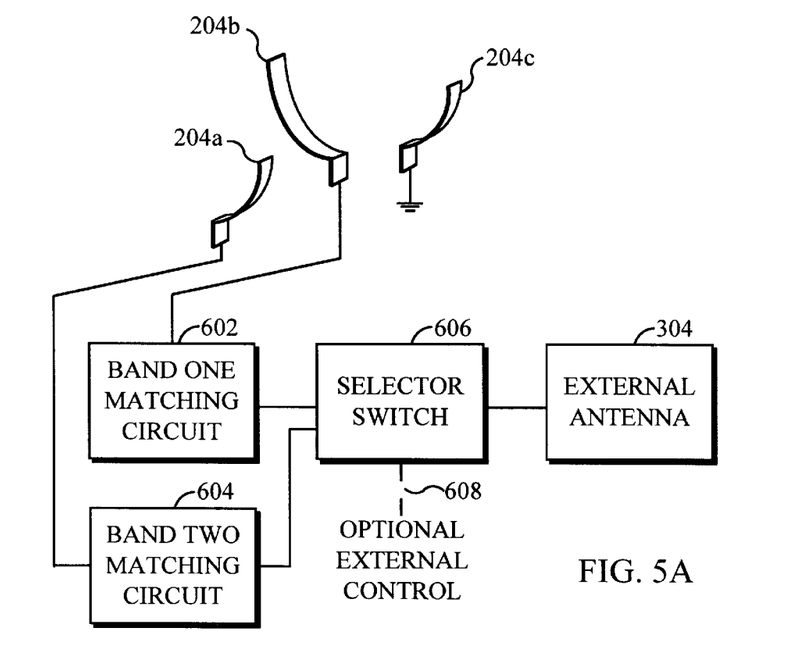
FIG. 5A is an illustration of one embodiment of the dual-band coupling elements of the present invention.

A dual-band implementation of antenna coupler 100 is illustrated in FIG. 5A. Outer coupling element 204c is coupled to ground plane 102 while 10 coupling elements 204a and 204b are electrically isolated from ground plane 102. Inner coupling element 204b couples RF energy from antenna 204 (see FIG. 1B) to a band one matching circuit 602. Band one matching circuit 602 is designed to match antenna 204 for operation at frequencies in a first band. Coupling element 204a couples RF energy from antenna 204 to a band two matching circuit 604. Band two matching circuit 604 is designed to match antenna 204 for operation at frequencies in a second band. The outputs of band one matching circuit 602 and band two matching circuit 604 are coupled to a selector switch 606. Selector switch 606 selects the output from one of the band matching circuits for coupling to external antenna 304.

Selector switch 606 may be any type of switching device such as a block diplexer, diode switch, transmission line diplexer, transistor switch, passive circuit, or the like. The operation of these conventional switching circuits is well known in the art and need not be described in greater detail herein. Also shown in FIG. 5A is an optional external control 608 for selector switch 606. With this optional embodiment, selector switch 606 may be digitally controlled by signals from portable radiotelephone 200. As is known in the art, dual-band radiotelephones typically include a serial output port which may be used to generate a control signal coupled to optional external control 608. Thus, selector switch 606 may be controlled by signals generated by portable radiotelephone 200.

Figure 5B:
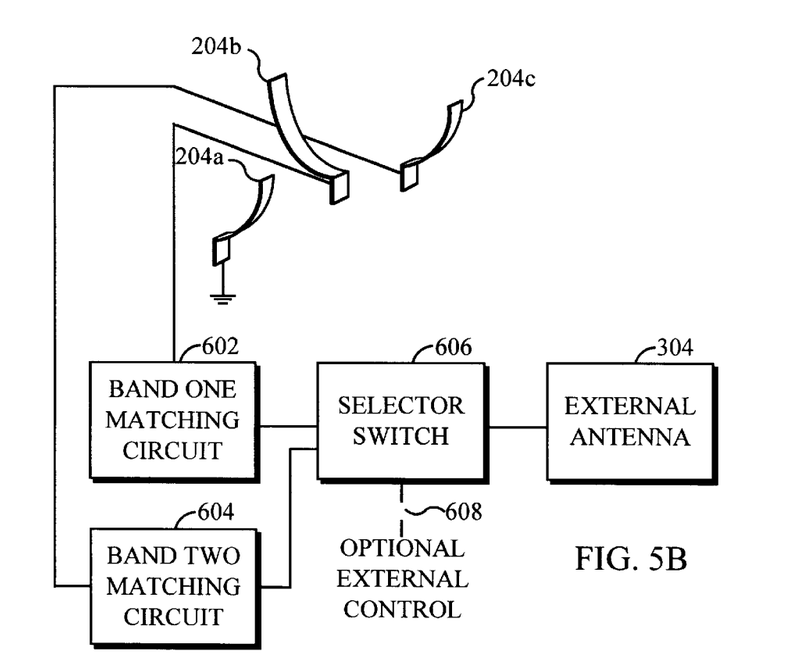
FIG. 5B is an illustration of an alternative embodiment of the dual-band coupling elements of the present invention.

An alternative connection scheme for coupling elements 204a–204c is illustrated in FIG. 5B. The operation of the circuit of FIG. 5B is identical to that of FIG. 5A, except that outer coupling element 204a is electrically connected to ground plane 102 in FIG. 5B while outer coupling element 204c is electrically isolated from ground plane and is used to couple RF energy from antenna 204 to band two matching circuit 604. The alternative arrangement of FIG. 5B has different RF characteristics than that of FIG. 2A, and may be more suitable for different operating frequency ranges or antenna structures.

Figure 6:
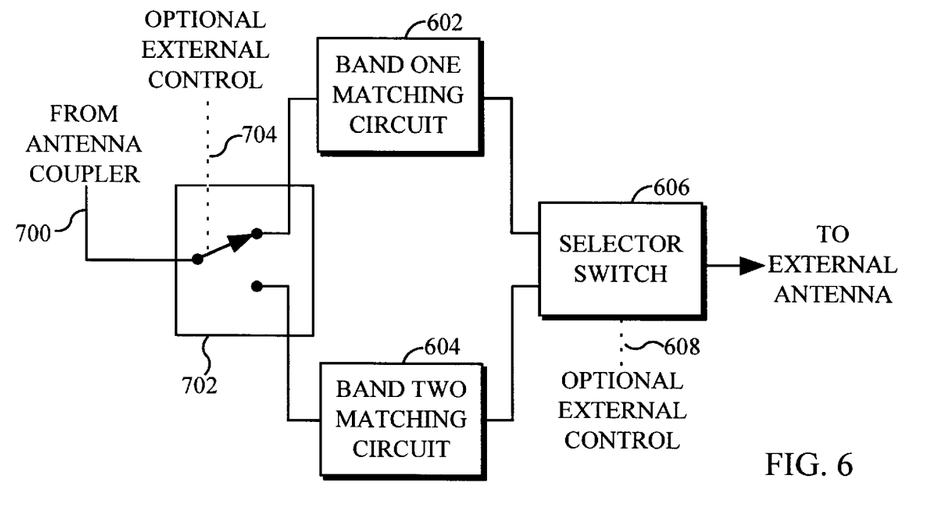
FIG. 6 is a functional block diagram of a dual-band matching circuit used with the antenna coupler of FIGS. 3A, 3B, 4A, and 4B.

The dual-band matching circuit of the present invention is also useful with embodiments of antenna coupler 100 illustrated in FIGS. 3A, 3B, 4A, and 4B. In the embodiments of antenna coupler 100 illustrated in FIGS. 5A and 5B, separate inputs are provided to band one matching circuit 602 and band two matching circuit 604 from the various antenna coupling elements 204a–204c. However, in the embodiments of antenna coupler 100 illustrated in FIGS. 3A, 3B, 4A, and 4B, RF signals are coupled from portable radiotelephone 200 via direct contact coupling pin 404 (see FIGS. 3A and 3B) or by helical coupler 504 (see FIGS. 4A and 4B). In FIG. 6, band one matching circuit 602 and band two matching circuit 604 are coupled to a single antenna lead 700 by switching circuit 702. Switching circuit 702 couples RF energy from antenna 204 to the matching circuit for the appropriate frequency band. Band one matching circuit 602, band two matching circuit 604, and selector switch 606 operate in the manner described above. Switching circuit 702 may be one of a number of known switching circuits, such as a block diplexer, diode switch, transmission line diplexer, transistor switch, passive circuit, or the like. FIG. 6 also illustrates an optional external control line 704 to control operation of switching circuit 702. As previously discussed with respect to selector switch 606, radiotelephone 200 may provide digital control signals through a serial port to control selection of both selector switch 606 and switching circuit 702.

Figure 7:
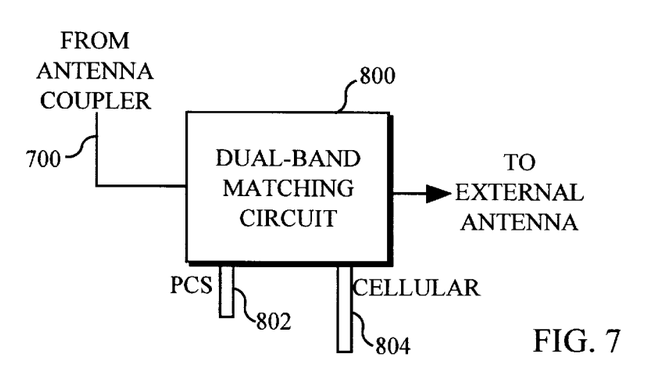
FIG. 7 is an alternative embodiment of the dual-band matching circuit used with the antenna coupler of FIGS. 3A, 3B, 4A, and 4B.

As those of ordinary skill in the art will recognize, the electrical circuitry for band one matching circuit 602 and band two matching circuit 604 may be combined in a single dual-band matching circuit 800 illustrated in FIG. 7. Dual-band matching circuit 800 is designed for optimized performance over both frequency bands. However, as those of skill in the art can appreciate, a combination matching circuit is not as well optimized as two individual circuits, such as band one matching circuit 602 and band two matching circuit 604. However, the advantage of the single dual-band matching circuit 800 is that it eliminates the need for selector switch 606 and switching circuit 702 if antenna coupler 100 uses single antenna lead 700. However, there are techniques to optimize performance of dual-band matching circuit 800. For operation with helical coupler 504 (see FIGS. 4A and 4B), helical coupler 504 can be optimized for dual-band operation with antenna 204. Alternatively, dual-band matching circuit 800 can be optimized for performance over two frequency bands through the use of lumped passive components or through the use of transmission line matching using tuning stubs 802 and 804 as resonators for PCS and cellular band operation, respectively.

In each of the above embodiments, antenna coupler 100 may be encased in a plastic or other non-conductive housing assembly 300 or the like in order to protect coupling elements 204a–204c, ground pins 206a–206c and ground plane 102 from damage, and to provide support for the structure of antenna coupler 100. Preferably, the housing assembly 300 encasing antenna coupler 100 would have a receptacle on a top face for receiving and securely capturing the portable radiotelephone 200 such that antenna 204 is brought within close proximity to coupling elements 204a–204c, and ground pins 206a–206c are physically aligned with, and securely mate with, the externally accessible grounds on portable radiotelephone 200, i.e., assembly screws 202 and/or battery ground port 206. Clearly, many different designs for the housing assembly 300 may be used without departing from the inventive concept of the present invention. For example, the housing assembly 300 may be fixedly mounted to a vehicle dash board. Alternatively, housing assembly 300 may be a more portable hand-held design that may be held close to the user's head.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An antenna coupling device for coupling radio frequency signals from a communication device having an antenna and at least one externally accessible ground point, the communication device operable in two frequency bands, the antenna coupling device comprising:

a ground plane having an upper surface;

an antenna coupler mounted on said ground plane upper surface, for coupling radio signals to and from the communication device antenna;

at least one ground pin, coupled to said upper surface of said ground plane, for contacting the at least one externally accessible ground point; and a matching circuit coupled to said antenna coupler to generate a predetermined impedance to match said antenna coupler to the communication device antenna at each of the first and second frequency bands.

2. The coupling device of claim 1 wherein said ground plane includes first and second abutting vertical portions mounted on said upper surface, said first and second abutting vertical portions being positioned in a substantially orthogonal relation to each other and to said upper surface.

3. The coupling device of claim 1 wherein said matching circuit comprises a first matching circuit for operation of the communication device in a first of the two frequency bands and a second matching circuit for operation of the communication device in a second of the two frequency bands.

4. The coupling device of claim 3 wherein said first and second matching circuits each have an independent output terminal, the coupler further including a selection circuit coupled to said first and second matching circuit output terminals to couple a selected one of said independent output terminals to a device output terminal.

5. The coupling device of claim 1 wherein said antenna coupler comprises a plurality of upward facing curved bands of metal, a first of said curved bands being electrically isolated from said ground plane to couple radio signals to and from the communication device antenna when the communication device is operating in a first of the two frequency bands, a second of said curved bands being electrically isolated from said ground plane to couple radio signals to and from the communication device antenna when the communication device is operating in a second of the two frequency bands, and a third of said curved bands of metal being electrically coupled to said ground plane.

6. The coupling device of claim 5 wherein said matching circuit comprises a first matching circuit portion having an input terminal to match the communication device antenna when the communications device is operating in said first frequency band and a second matching circuit portion having an input terminal to match the communication device antenna when the communications device is operating in said second frequency band, said first matching circuit portion input terminal being coupled to said first of said curved bands, said second matching circuit portion input terminal being coupled to said second of said curved bands.

7. The coupling device of claim 1 wherein said antenna coupler comprises a metal pin sized to permit physical contact with the communication device antenna when the communication device is operable with the coupling device.

8. The coupling device of claim 7 wherein said matching circuit is a dual-band matching circuit coupled to said antenna coupler to generate a predetermined impedance to substantially match said antenna coupler to the communication device antenna at each of the first and second frequency bands.

9. The coupling device of claim 7 wherein said matching circuit comprises a first matching circuit portion for operation of the communication device in a first of the two frequency bands and a second matching circuit portion for operation of the communication device in a second of the two frequency bands, the coupling device further including a switch circuit coupled between said metal pin and said first and second matching circuit portions to select one of said first and second matching circuits for operation with said antenna coupler, said switch circuit coupling said metal pin to said first matching circuit portion for operation of the communication device in said first frequency band and coupling said metal pin to said second matching circuit portion for operation of the communication device in said second frequency band.

10. The antenna coupler of claim 1 wherein said antenna coupler comprises a helical wire for surrounding at least a portion of the communication device antenna when the communication device is operable with the coupling device.

11. An antenna coupling device for coupling radio frequency signals from a communication device having an internal antenna and at least one externally accessible ground point, the communication device operable in two frequency bands, the antenna coupler comprising:

a connector coupleable to an external antenna;

a ground plane having an upper surface and sized to match the communication device;

an antenna coupler mounted on said ground plane upper surface, for coupling radio signals between the communication device antenna and said external antenna connector;

at least one ground pin, coupled to said upper surface of said ground plane, for contacting the externally accessible ground point; and a matching circuit coupled to said antenna coupler to receive the radio frequency signals and to generate a predetermined impedance to match said antenna coupler to the communication device antenna and said external antenna connector at each of the first and second frequency bands.

12. The coupling device of claim 11 wherein said ground plane includes first and second abutting vertical portions mounted on said upper surface, said first and second abutting vertical portions being positioned in a substantially orthogonal relation to each other and to said ground plane upper surface.

13. The coupling device of claim 11, further including an external amplifier operationally coupled between said matching circuit and said external antenna connector to amplify signals between the communication device antenna and said external antenna connector.

14. The coupling device of claim 11 wherein said antenna coupler comprises a plurality of upward facing curved metal bands, a first of said metal bands being electrically isolated from said ground plane to couple radio signals between the communication device antenna and said external antenna when the communications device is operating in a first of the two frequency bands, a second of said metal bands being electrically isolated from said ground plane to couple radio signals between the communication device antenna and said external antenna when the communications device is operating in a second of the two frequency bands, and a third of said metal bands being electrically coupled to said ground plane.

15. The coupling device of claim 14 wherein said matching circuit comprises a first matching circuit having an input terminal to match the communication device antenna when the communications device is operating in said first frequency band and a second matching circuit having an input terminal to match the communication device antenna when the communications device is operating in said second frequency band, said first matching circuit input terminal being coupled to said first metal band, said second matching circuit input terminal being coupled to said second metal band.

16. The coupling device of claim 11 wherein said antenna coupler comprises a metal pin sized to permit physical contact with the communication device antenna when the communication device is operable with the coupling device.

17. The coupling device of claim 16 wherein said matching circuit is a dual-band matching circuit coupled to said antenna coupler to generate a predetermined impedance to substantially match said antenna coupler to the communication device antenna at each of the first and second frequency bands.

18. The coupling device of claim 16 wherein said matching circuit comprises a first matching circuit for operation of the communication device in a first of the two frequency bands and a second matching circuit for operation of the communication device in a second of the two frequency bands, the coupling device further including a switch circuit coupled between said metal pin and said first and second matching circuits to select one of said first and second matching circuits for operation with said antenna coupler, said switch circuit coupling said metal pin to said first matching for operation of the communication device in said first frequency band and coupling said metal pin to said second matching for operation of the communication device in said second frequency band.

19. The antenna coupler of claim 11 wherein said antenna coupler comprises a helical wire for surrounding at least a portion of the communication device antenna when the communication device is operable with the coupling device.

20. The coupling device of claim 11 wherein said matching circuit has first and second output terminals for operation of the communication device in the first and second bands, respectively, the coupler further including a selection circuit coupled to said first and second output terminals to couple a selected one of said first and second output terminals to a device output terminal with said first output terminal being selected for operation of the communication device in the first frequency band and said second output terminal being selected for operation of the communication device in the second frequency band.

* * * * *